(12) United States Patent
Hyun et al.

(10) Patent No.: US 10,608,131 B2
(45) Date of Patent: Mar. 31, 2020

(54) SOLAR CELL PANEL AND METHOD FOR MANUFACTURING THE SAME

(71) Applicant: LG ELECTRONICS INC., Seoul (KR)

(72) Inventors: Daeseon Hyun, Seoul (KR); Ayoung Bak, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/055,854

(22) Filed: Aug. 6, 2018

(65) Prior Publication Data

US 2019/0044013 A1    Feb. 7, 2019

(30) Foreign Application Priority Data

Aug. 4, 2017 (KR) .......................... 10-2017-0098957

(51) Int. Cl.

| | |
|---|---|
| *H01L 31/18* | (2006.01) |
| *H01L 31/0224* | (2006.01) |
| *H01L 31/05* | (2014.01) |
| *H02S 40/34* | (2014.01) |
| *H01L 31/0216* | (2014.01) |
| *H01L 31/042* | (2014.01) |

(52) U.S. Cl.
CPC .... *H01L 31/0512* (2013.01); *H01L 31/02164* (2013.01); *H01L 31/02168* (2013.01); *H01L 31/022425* (2013.01); *H01L 31/022441* (2013.01); *H01L 31/042* (2013.01); *H01L 31/0516* (2013.01); *H01L 31/1864* (2013.01); *H02S 40/34* (2014.12)

(58) Field of Classification Search
CPC ..... H01L 31/18; H01L 31/05; H01L 31/0224; H01L 31/0516; H01L 31/1864; H02S 40/30; H02S 40/34
See application file for complete search history.

(56) References Cited

U.S. PATENT DOCUMENTS

| | | | |
|---|---|---|---|
| 6,515,372 B1* | 2/2003 | Narizuka | H01L 21/4853 257/779 |
| 2013/0095604 A1* | 4/2013 | Biro | H01L 31/02242 438/98 |

* cited by examiner

*Primary Examiner* — Susan D Leong (74) *Attorney, Agent, or Firm* — Birch, Stewart, Kolasch & Birch, LLP

(57) ABSTRACT

Disclosed is a solar cell including: a solar cell including an electrode; a wiring portion electrically connected to the electrode of the solar cell; a connection member positioned between the electrode and the wiring portion at a connection portion of the electrode and the wiring portion to electrically connect the electrode and the wiring portion; and an insulating layer covering the electrode entirely where the connection member is not positioned to insulate the electrode and the wiring portion at a portion other than the connection portion. The insulating layer includes an organic solderability preservative (OSP).

12 Claims, 10 Drawing Sheets

SOLAR CELL PANEL AND METHOD FOR MANUFACTURING THE SAME

CROSS-REFERENCE TO RELATED APPLICATION

This application claims priority to and the benefit of Korean Patent Application No. 10-2017-0098957, filed in the Korean Intellectual Property Office on Aug. 4, 2017, the entire contents of which are incorporated herein by reference.

BACKGROUND OF THE INVENTION

Field of the Invention

Embodiments of the invention relate to a solar cell panel and a method for manufacturing the same, and, more particularly, to a solar cell panel having an improved structured and manufactured by an improved process and a method for manufacturing the same.

Description of the Related Art

Recently, as existing energy resources such as petroleum and coal are expected to be depleted, interest in alternative energy to replace them is increasing. Among them, solar cells are attracting attention as a next-generation battery that converts solar energy into electric energy.

A plurality of such solar cells are connected in series or in parallel by wirings, and are manufactured in a form of a solar cell panel by a packaging process for protecting the plurality of solar cells. In this instance, the wirings and the solar cell need to be electrically connected to each other at the necessary portions and need to be insulated from the other portions, which a process may be complicated and a solar cell may be damaged in the process. As a result, efficiency of the solar cell is lowered, an output of the solar cell panel is lowered, and long-term reliability may be deteriorated.

SUMMARY OF THE INVENTION

Therefore, embodiments of the invention have been made in view of the above problems, and the invention is to provide a solar cell panel having a high output and excellent long-term reliability and being manufactured by a simple manufacturing process, and a method for manufacturing a solar cell panel.

A solar cell panel according to an embodiment of the invention includes a solar cell including an electrode; a wiring portion electrically connected to the electrode of the solar cell; a connection member positioned between the electrode and the wiring portion at a connection portion of the electrode and the wiring portion to electrically connect the electrode and the wiring portion; and an insulating layer covering the electrode entirely where the connection member is not positioned to insulate the electrode and the wiring portion at a portion other than the connection portion. The insulating layer includes an organic solderability preservative (OSP).

A method for manufacturing a solar cell panel includes: forming an insulating layer on an electrode of a solar cell; forming a connection member on the insulating layer to correspond to a connection portion on which the electrode and the wiring portion are to be connected; performing a heat-treatment on the connection member so as to penetrate through the insulating layer and to be connected to the electrode at the connection portion; and attaching a wiring portion on the electrode at the connection portion through the connection member.

According to the embodiment, a connection member penetrating through an insulating layer can be formed by a simple process, and thus, a structure and a process of a solar cell panel can be simplified. Since an oxide layer which may be undesirably formed on electrodes is prevented from being formed by the insulating layer acting as a surface treatment layer, a separate process for removing the oxide layer is not performed. Accordingly, the process can be simplified more and the damage of the solar cell which may occur in the process of removing the oxide layer can be prevented. Accordingly, the solar cell panel having high output and excellent long-term reliability can be manufactured by a simple manufacturing process.

DETAILED DESCRIPTION OF THE EMBODIMENTS

Reference will now be made in detail to various embodiments of the invention, examples of which are illustrated in the accompanying drawings. The invention may, however, be embodied in many alternate forms and should not be construed as limited to the embodiments set forth herein.

In the drawings, illustration of parts unrelated to embodiments of the invention is omitted for clarity and simplicity of description. The same reference numerals designate the same or very similar elements throughout the specification. In the drawings, thicknesses, widths or the like of elements are exaggerated or reduced for clarity of description, and should not be construed as limited to those illustrated in the drawings.

It will be understood that the terms "comprise" and/or "comprising," or "include" and/or "including" used in the specification specify the presence of stated elements, but do not preclude the presence or addition of one or more other elements. In addition, it will be understood that, when an element such as a layer, film, region, or plate is referred to as being "on" another element, it may be directly disposed on another element or may be disposed such that an intervening element is also present therebetween. Accordingly, when an element such as a layer, film, region, or plate is disposed "directly on" another element, this means that there is no intervening element between the elements.

Figure 1:
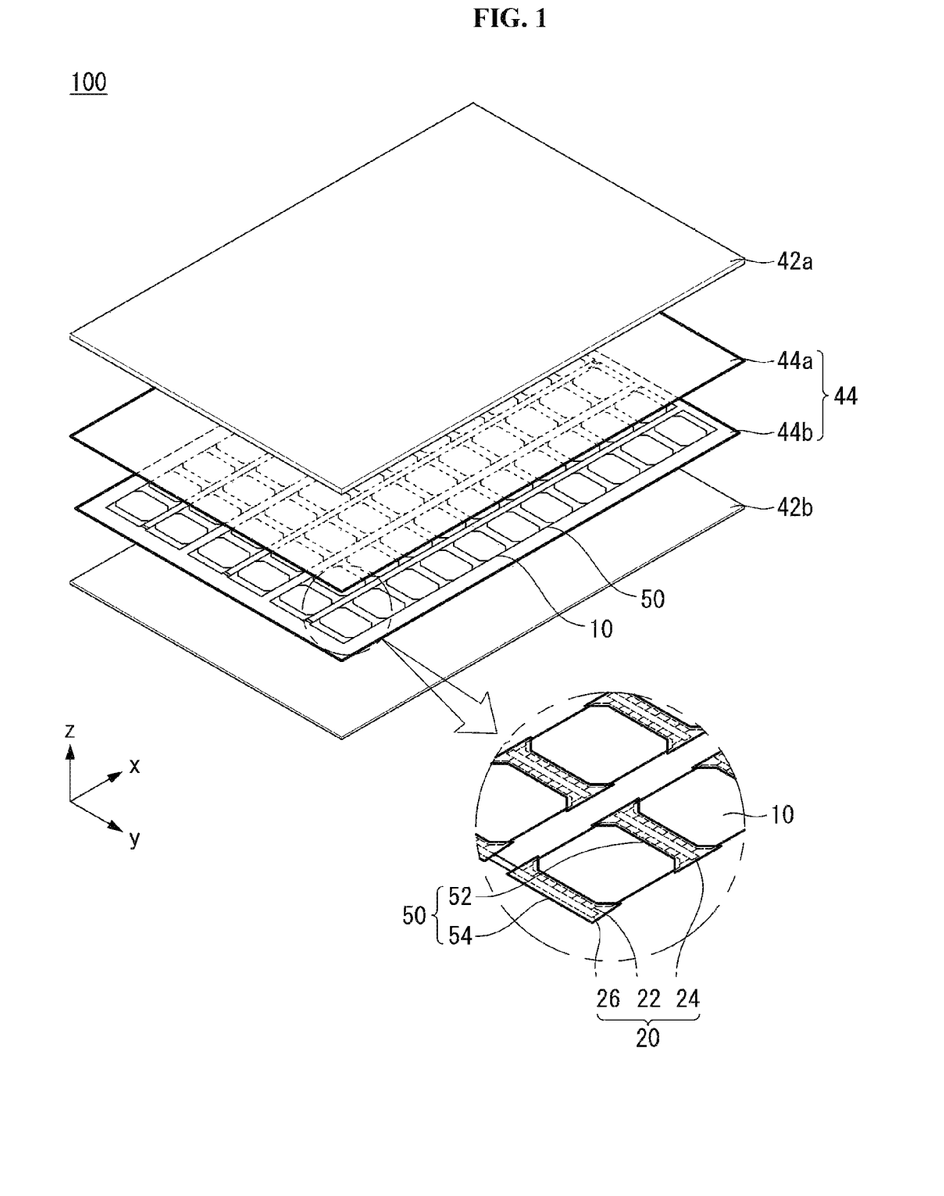
FIG. 1 is an exploded perspective view schematically showing a solar cell panel according to an embodiment of the invention.
Figure 2:
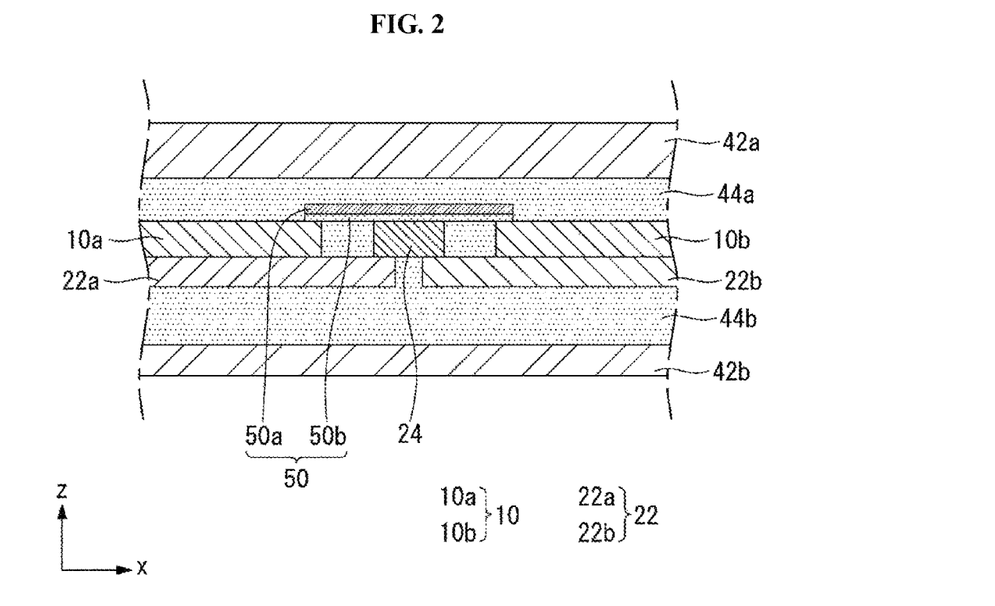
FIG. 2 is a schematic view showing two solar cells included in the solar cell panel shown in FIG. 1.
Figure 3:
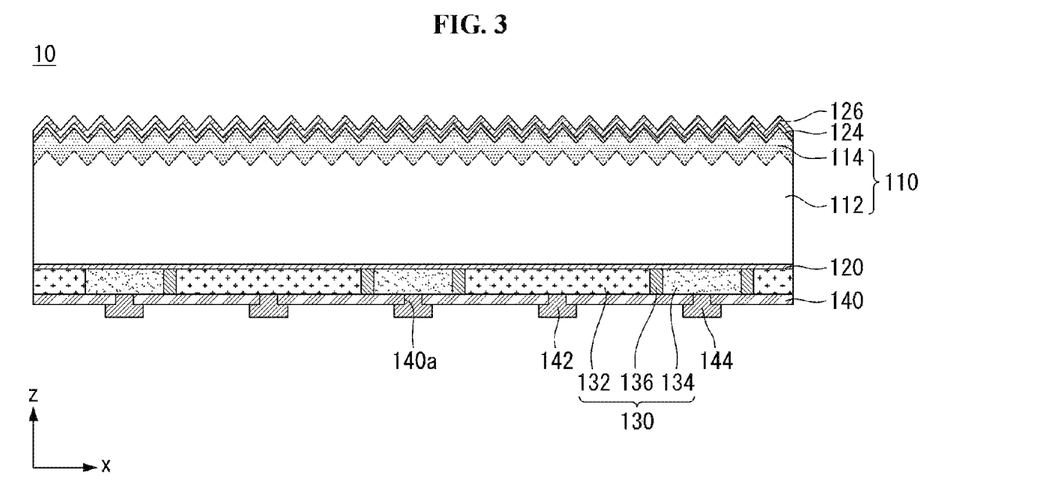
FIG. 3 is a cross-sectional view showing an example of a solar cell included in the solar cell panel shown in FIG. 1.

FIG. 1 is an exploded perspective view schematically showing a solar cell panel according to an embodiment of the invention, and FIG. 2 is a schematic view showing two solar cells included in the solar cell panel shown in FIG. 1. FIG. 3 is a cross-sectional view showing an example of a solar cell 10 included in the solar cell panel 100 shown in FIG. 1. For reference, FIG. 2 is a cross-sectional view corresponding to line IV-IV in FIG. 4. All the components of the solar cell and a solar cell panel according to all embodiments of the invention are operatively coupled and configured.

Referring to FIGS. 1 to 3, a solar cell panel 100 according to an embodiment of the invention includes a solar cell 10 having an electrode 142 and 144, a wiring portion 20 electrically connected to the electrode 142 and 144 of the solar cell 10, a connection member 32 positioned between the electrode 142 and 144 and the wiring portion 20 at a connection portion CP of the electrode 142 and 144 and the wiring portion 20 to electrically connect the electrode 142 and 144 and the wiring portion 20, and an insulating layer 34 covering the electrode 142 and 144 entirely at a portion where the connection member 32 is not positioned to insulate the electrode 142 and 144 and the wiring portion 20 at a portion other than the connection portion CP. In this instance, the insulating layer 34 includes an organic solderability preservative (OSP).

The solar cell panel 100 includes a sealing member 44 that surrounds and seals the solar cell 10 and the wiring portion 20, a first member 42a positioned on a surface (e.g., a front surface) of the solar cell 10 on the sealing member 44, and a second member 42b positioned on the other surface (e.g., a back surface) of the solar cell 10 on the sealing member 44. This will be described in more detail.

First, the solar cell 10 includes a semiconductor substrate 110 and an electrode 142 and 144 (that is, first and second electrodes 142 and 144) disposed on one surface (e.g., a back surface) of the semiconductor substrate 110. This will be described in detail later with reference to FIG. 3.

In the embodiment, the solar cell panel 100 can include a plurality of solar cells 10, and the plurality of solar cells 10 can be electrically connected in series, parallel, or series-parallel by the wiring portion 20.

More specifically, the wiring portion 20 can include a wiring member 22 and a connection wiring 24. At least a part of the wiring member 22 can overlap the first and second electrodes 142 and 144 of each solar cell 10 to be connected to the first and second electrodes 142 and 144. The connection wiring 24 can be positioned in a direction crossing the wiring member 22 between the solar cells 10 and be connected to the wiring member 22. A plurality of solar cells 10 can be connected in one direction (an x-axis direction in the drawings) by the wiring member 22 and the connection wiring 24 to form one row (i.e., a solar cell string). The wiring portion 20 can further include a bus bar wiring 26 positioned at both ends of the solar cell string and connecting a solar cell string to another solar cell string or a junction box.

The wiring member 22, the connection wiring 24, and the bus bar wiring 26 can each include a conductive material (for example, a metal material). For example, the wiring member 22, the connection wiring 24, and the bus bar wiring 26 can include a conductive core including any one of gold (Au), silver (Ag), copper (Cu), and aluminum (Al), and a conductive coating layer that can be disposed on a surface of the conductive core and includes tin (Sn) or an alloy including tin. In one example, the conductive core can be formed of copper (Cu), and the conductive coating layer can be formed of SnBiAg, which can be an alloy including tin (Sn). However, embodiments of the invention are not limited thereto, and a material, a shape, a connection structure, etc. of the wiring member 22, the connection wiring 24, and the bus bar wiring 26 can be variously modified.

The sealing member 44 can include a first sealing member 44a positioned on the front surface of the solar cells 10 connected by the wiring portion 20 and a second sealing member 44b positioned on the back surface of the solar cells 10 connected by the wiring portion 20. The first sealing member 44a and the second sealing member 44b prevent moisture and oxygen from entering and chemically bind elements of the solar cell panel 100. The first and second sealing members 44a and 44b can be made of an insulating material having translucency and adhesiveness. For example, an ethylene-vinyl acetate copolymer resin (EVA), a polyvinyl butyral, a silicone resin, an ester-based resin, an olefin-based resin, or the like can be used for the first sealing member 44a and the second sealing member 44b. The second member 42b, the second sealing member 44b, the solar cell 10, the wiring portion 20, a shield member 50, and the first sealing member 44a, and the first member 42a can be integrated to constitute the solar cell panel 100 through a lamination process using the first and second sealing members 44a and 44b.

The first member 42a can be disposed on the first sealing member 44a to constitute a front surface of the solar cell panel 100 and the second member 42b can be disposed on the second sealing member 44b to constitute a back surface of the solar cell panel 100. The first member 42a and the second member 42b can be made of an insulating material capable of protecting the solar cell 10 from external shock, moisture, ultraviolet rays, or the like. The first member 42a can be made of a light-transmissive material capable of transmitting light, and the second member 42b can be made of a sheet made of a light-transmitting material, a non-light-transmitting material, or a reflective material. For example, the first member 42a can be formed of a glass substrate or the like, and the second member 42b can be formed of a film or a sheet. The second member 42b can have a TPT (Tedlar/PET/Tedlar) type or a polyvinylidene fluoride (PVDF) resin layer formed on at least one side of a base film (for example, polyethylene terephthalate, PET).

However, embodiments of the invention are not limited thereto. Accordingly, the first or second sealing member 44a or 44b, the first member 42a, or the second member 42b can include any of various materials other than those described above, and can have any of various shapes. For example, the first member 42a or the second member 42b can have any of various forms (e.g., a substrate, film, sheet, etc.) or any of various materials.

Referring to FIG. 3, the solar cell 10 that can be applied to the solar cell panel 100 according to the embodiment includes a photoelectric convension portion including a semiconductor substrate 110, and first and second electrodes 142 and 144 connected to the photoelectric convension portion. In this instance, the first and second electrodes 142 and 144 can include portions formed in parallel with each other. In the embodiment, the first electrode 142 and the second electrode 144 can be formed parallel to each other while being positioned together on one surface (e.g., a back surface) of the photoelectric conversion portion. Thus, the solar cell 10 can have a back contact structure.

In the embodiment, the photoelectric conversion portion can include the semiconductor substrate 110 and a conductive region 132 and 134 positioned on or at the semiconductor substrate 110. In the embodiment, a first conductive region 132 and a second conductive region 134 that are involved in carriers having polarities opposite to each other can be positioned on one surface (e.g., the back surface) of the semiconductor substrate 110. In this instance, the first and second conductive regions 132 and 134 are positioned separately from the semiconductor substrate 110 by a control passivation layer 120 interposed therebetween.

In one example, the semiconductor substrate 110 can include a base region 112 made of a crystalline semiconductor (for example, a single-crystalline or a polycrystalline semiconductor, for example, a single-crystalline or a polycrystalline silicon wafer, particularly a single-crystalline silicon wafer). The solar cell 10 based on the semiconductor substrate 110 or the base region 112 having a high degree of crystallinity and having few defects has excellent electrical properties. A front surface field region 114 having the same conductivity type as the base region 112 and having a higher doping concentration than the base region 112 can be positioned on or at the front surface of the semiconductor substrate 110. An anti-reflection structure (for example, a pyramid-shaped texturing structure including a (111) surface of the semiconductor substrate 110) for preventing reflection can be formed at the front surface of the semiconductor substrate 110, while the back surface of the semiconductor substrate 110 can be a mirror-polished surface or can have a smaller surface roughness than the front surface. However, embodiments of the invention are not limited thereto and various modifications are possible.

The control passivation layer 120 can be formed of an oxide layer, a dielectric layer or an insulating layer including silicon, an oxynitride layer, an oxycarbonate layer, or the like. As an example, the control passivation layer 120 can be a silicon oxide layer.

The first and second conductive regions 132 and 134 can be formed of an amorphous semiconductor, a microcrystalline semiconductor, a polycrystalline semiconductor (for example, amorphous silicon, microcrystalline silicon, or polycrystalline silicon) which is doped by a dopant. In particular, when the first and second conductive regions 132 and 134 have a polycrystalline semiconductor, a carrier mobility can be high. For example, when the first or second conductivity type dopant is a p-type, a group 3 element such as boron (B), aluminum (Al), gallium (Ga), or indium (In) can be used. When the first or second conductivity type dopant is an n-type, a group 5 element such as phosphorus (P), arsenic (As), bismuth (Bi), and antimony (Sb) can be used. In one example, one of the first and second conductivity type dopants can be boron (B) and the other can be phosphorus (P).

In this instance, an area (for example, a width) of the first conductive region 132 can be larger than an area (for example, a width) of the second conductive region 134. The first conductive region 132 serving as an emitter region has a larger area than the second conductive region 134 serving as a back surface field region, which is advantageous for photoelectric conversion. In the embodiment, the first and second conductive regions 132 and 134 are co-positioned in a semiconductor layer 130 to be positioned in the same plane, and a barrier region 136 formed of an intrinsic semiconductor, which is not doped, can be provided between the first and second conductive regions 132 and 134.

However, embodiments of the invention are not limited thereto. Therefore, the control passivation layer 120 need not be provided. Alternatively, at least one of the first and second conductive regions 132 and 134 can be a doped region formed by doping a part of the semiconductor substrate 110 to constitute a part of the semiconductor substrate 110. Also, the barrier region 136 can be not provided, or the barrier region 136 can include a material other than a semiconductor material. Various other variations are possible.

A front passivation layer 124 and/or an anti-reflection layer 126 can be entirely formed on the front surface of the semiconductor substrate 110 (for example, on the front surface field region 114 formed on or at the front surface of the semiconductor substrate 110). A back passivation layer 140 can be entirely positioned on the back surface of the semiconductor layer 130 except for a contact hole 140a. For example, the front passivation layer 124, the anti-reflection layer 126, or the back passivation layer 140 can include one layer of a silicon nitride layer, a silicon nitride layer including hydrogen, a silicon oxide layer, a silicon oxynitride layer, an aluminum oxide layer, a silicon carbide layer, $MgF_2$, $ZnS$, $TiO_2$, and $CeO_2$, or a multi-layered structure which two or more layers including at least one of the above are stacked.

The first electrode 142 can be electrically connected to (e.g., in contact with) the first conductive region 132 through the contact hole 140a and the second electrode 144 can be electrically connected to (e.g., in contact with) the second conductive region 134 through the contact hole 140a. The first electrode 142 and the second electrode 144 can be formed of a conductive material (e.g., metal).

The wiring portion 20 including the wiring member 22 can be electrically connected to the solar cell 10 so that the solar cell 10 can be electrically connected to another solar cell 10 or an external circuit. Hereinafter, a structure of the solar cell 10 and the wiring portion 20 will be described in more detail with reference to FIGS. 4 and 5.

Figure 4:
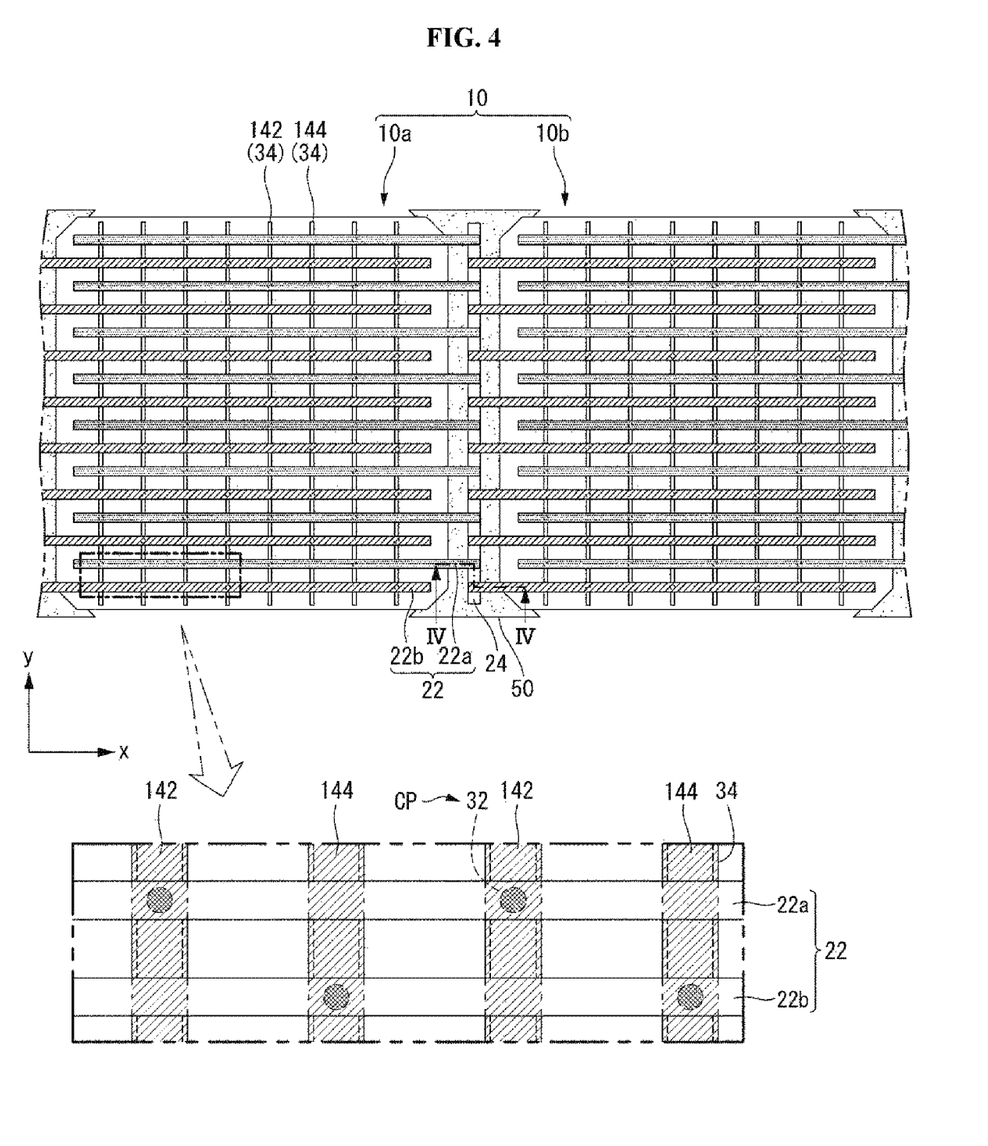
FIG. 4 is a black plan view schematically showing two solar cells, a wiring member, a connection wiring, an insulating layer, a connection member, and a shield member included in the solar cell panel shown in FIG. 1.
Figure 5:
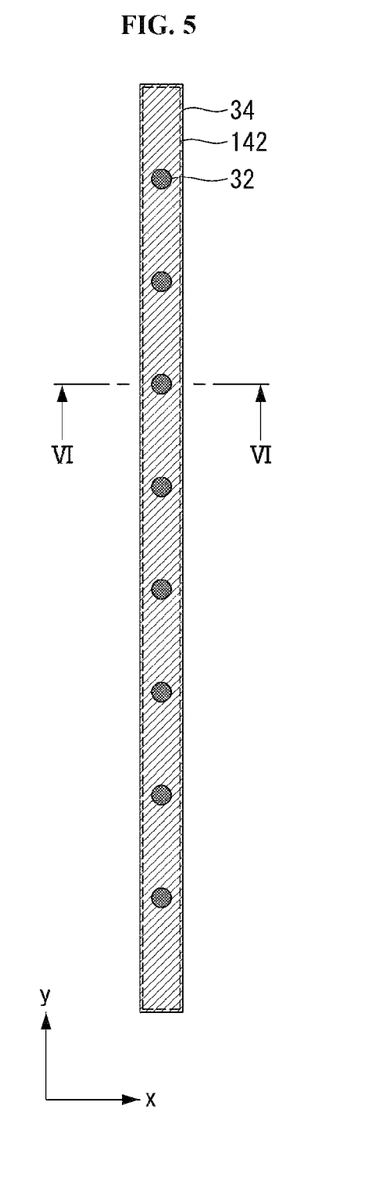
FIG. 5 is a back plan view showing one first electrode, and an insulating layer and connection members formed thereon in FIG. 4.
Figure 6:
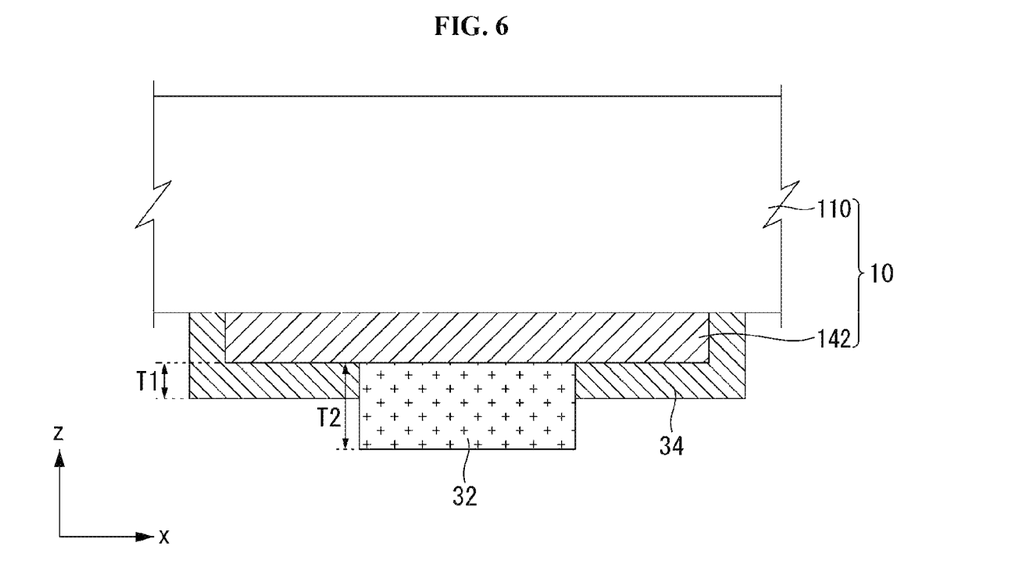
FIG. 6 is a cross-sectional view showing the solar cell, and the insulating layer and the connection member, taken along line VI-VI of FIG. 5.

FIG. 4 is a back plan view schematically showing two solar cells 10, a wiring member 22, a connection wiring 24, an insulating layer 34, a connection member 32, and a shield member 50 included in the solar cell panel 100 shown in FIG. 1. FIG. 5 is a back plan view showing one first electrode 142, and an insulating layer 34 and connection members 32 formed thereon in FIG. 4, and FIG. 6 is a cross-sectional view showing the solar cell, and the insulating layer 34 and the connection member 32, taken along line VI-VI of FIG. 5. Only the semiconductor substrate 110 and the first and second electrodes 42 and 44 are shown with respect to the solar cell 10 for clarity and simplicity. Two solar cells 10 adjacent to each other are referred to as a first solar cell 10a and a second solar cell 10b in the following description for clear distinction.

Referring to FIGS. 1 to 6, a first electrode 142 of a first solar cell 10a and a second electrode 144 of a second solar cell 10b are electrically connected by a plurality of wiring members 22 and a connection wiring 24.

In the embodiment, the first electrode 142 can include a plurality of first electrodes 142 longitudinally extending in a first direction (a y-axis direction in the drawings), and the second electrode 144 can include a plurality of second electrodes 144 longitudinally extending in the first direction. In addition, the first electrodes 142 and the second electrodes 144 can be alternately disposed in a second direction (an x-axis direction in the drawings) crossing the first direction. The first and second electrodes 142 and/or 144 can include a plurality of metal layers formed by sputtering. For example, electrodes 142 and/or 144 adjacent to (particularly, being in contact with) the connection member 32 can include a nickel-vanadium alloy layer.

In this instance, the first and second conductive regions 132 and 134 can have shapes corresponding to the first electrode 142 and the second electrode 144, respectively. Accordingly, the first conductive region 132 can include a plurality of portions extending in the first direction to correspond to the plurality of first electrodes 142. The second conductive region 134 can include a plurality of portions extending in the first direction to correspond to the plurality of second electrodes 144. However, the first and second conductive regions 132 and 134 can have a greater width than the first and second electrodes 142 and 144, respectively. A barrier region 136 can be positioned between the first conductive region 132 and the second conductive region 134. However, embodiments of the invention are not limited thereto, and the first and second conductive regions 132 and 134 can have different shapes from the first and second electrodes 142 and 144.

The wiring member 22 includes a first wiring 22a extending in the second direction and electrically connected to the first electrode 142 and a second wiring 22b extending in the second direction and electrically connected to the second electrode 144. A plurality of first wirings 22a can be provided and a plurality of second wirings 22b can be provided and the first wirings 22a and the second wirings 22b can be alternately arranged in the first direction. Then, the plurality of first and second wirings 22a and 22b are connected to the first and second electrodes 142 and 144 with a uniform interval, and the carriers can be effectively collected and transferred.

In this instance, the first wiring 22a can be electrically connected to the first electrode 142 of each solar cell 10 through the connection member 32, and the second wiring 22b can be electrically connected to the second electrode 144 of each solar cell 10 through the connection member 32. The first wiring 22a and the second electrode 144, and the second wiring 22b and the first electrode 142 can be insulated from each other by an insulating layer 34.

More specifically, portions of the first wiring 22a and the first electrode 142 are overlapped, and the connection member 32 having conductivity can be disposed between the first wiring 22a and the first electrode 142 at the overlapped portion of the first wiring 22a and the first electrode 142 (that is, a connection portion CP) so that the first wire 22a and the first electrode 142 can be electrically connected to each other. Similarly, portions of the second wiring 22b and the second electrode 144 are overlapped, and the connection member 32 having conductivity can be disposed between the second wiring 22b and the second electrode 144 at the overlapped portion of the second wiring 22b and the second electrode 144 (that is, a connection portion CP) so that the second wire 22b and the second electrode 144 can be electrically connected to each other.

The insulating layer 34 can be formed entirely on the electrodes 142 and 144 except for portions where the connection members 32 are formed, that is, the connection portions CP. As a result, a side surface of the connection member 32 and a side surface of the insulating layer 34 can be in contact with each other.

More particularly, a plurality of connection members 32, each having an island shape to correspond to the connection portions CP, are arranged at a predetermined interval in the first direction in the respective electrode 142 or 144, and the insulating layer 34 can be entirely formed at least on a portion of the electrode 142 or 144 other than the portion where the connection members 32 are formed. In this instance, the insulating layer 34 can be formed entirely on a surface of the electrode 142 or 144 (that is, a surface parallel to the first or second member 42a or 42b) and side surfaces of the electrode 142 or 144.

The insulating layer 34 and the connection members 32 having the above-described structure are formed by forming the insulating layer 34 and then forming the connection members 32 so as to penetrate the insulating layer 34. This will be described in detail later in a method for manufacturing a solar cell panel 100.

It is exemplified that the insulating layer 34 can formed on an entire portion of the electrode 142 or 144 to correspond only to the electrode 142 or 144 and thus the insulating layer 34 need not be formed on at least a part of a portion where the electrodes 142 and 144 are not formed in FIG. 4. The insulating layer 34 of this shape can be easily formed by being positioned only on the electrodes 142 and 144 using wettability, which will be described later in more detail in the method for manufacturing the solar cell panel 100. In this instance, it is exemplified that the insulating layer 34 can be integrally formed so as to entirely cover edges of the plurality of connection members 32, each having an island shape, on the respective electrode 142 or 144 since a size or a width of the connection member 32 in the second direction can be smaller than a width of the electrode 142 or 144. Accordingly, the connection member 32 can be stably connected to the electrodes 142 and 144, and an effect of the insulating layer 34 can be sufficiently achieved.

However, embodiments of the invention are not limited thereto. As a modified embodiment, the connection member 32 can have a width or width greater than or equal to a width of the electrode 142 or 144 in the second direction and the insulating layers 34 can have a shape including a plurality of portions are spaced apart from each other with the connection member 32 interposed therebetween in the first direction. In this instance, the insulating layer 34 can be formed to surround only a part of edges of the connection member 32, but the insulating layer 34 can be entirely formed on the electrodes 142 and 144 except for portions where the connection members 32 are formed. As another modified embodiment, the insulating layer 34 can be integrally formed on one surface (i.e., a back surface) of the solar cell 10 and thus can be integrally formed on the plurality of electrodes 142 and 144 at a portion other than the connection members 32. Alternatively, the insulating layer 34 can have a structure of integrally covering a plurality of electrodes 142 and 144 positioned at a part of the solar cell 10 even though the insulating layer 34 need not be entirely formed on the back surface of the solar cell 10.

Referring again to FIGS. 1 to 4, in the embodiment, the insulating layer 34 includes an organic solderability preservative (OSP), and the connection member 32 can include a solder material. In particular, the connection member 32 can further include an acidic material, and can further include an alcoholic material.

The organic solderability preservative can be a material formed by applying a salt that can be free from contamination of impurities which can be generated by a reaction with a metal in order to prevent the electrodes 142 and 144 from oxidizing or changing properties due to contact with atmospheric or moisture. Any of various materials known as organic solderability preservative can be used for the organic solderability preservative, for example, an imidazole-based material (e.g., alkylbenzimidazole) can be used.

The connection member 32 includes a solder material that enables soldering, which can include any of various materials known as solder materials. For example, the solder material can include tin, for example, can include at least one of Sn, SnAgCu, SnPb, SnBiCuCo, SnBiAg, SnPbAg, or SnAg. However, embodiments of the invention are not limited thereto, and the solder material can further include any of other materials.

The acidic material and/or the alcoholic material of the connection member 32 can be a material added to a flux (e.g., a post-flux). The flux can be added for removing the insulating layer 34 formed of the organic solderability preservative or assisting a removal of the insulating layer 34 formed of the organic solderability preservative during a heat-treatment. Any of various materials known as a post-flux, or acidic and alcoholic materials included therein, can be used. The post-flux can be provided in a form of a separate flux layer in a manufacturing process or can be remained or retained in a formed of a solder paste constituting the connection member 32. After the soldering, the acidic material of the post-flux can be remained or retained, and the alcoholic material of the post-flux can be remained or retained, or be volatilized or removed and thus not remained or retained. When the acidic material is included, the insulating layer 34 can be effectively removed from a portion where the connection member 32 can be formed. When a surface of the electrodes 142 and 144 includes a nickel-vanadium alloy layer, the nickel-vanadium alloy layer and the connection member 32 are tightly and strongly coupled to each other, and thus, adhesion properties between the electrodes 142 and 144 and the connection member 32 can be greatly improved.

The insulating layer 34 including the organic solderability preservative can be easily formed by a simple process. The insulating layer 34 including the organic solderability preservative can have an excellent insulating property so that the electrodes 142 and 144 and the wiring portion 20 are not electrically connected to each other at an undesired portion. Also, the insulating layer 34 has excellent anti-corrosion, anti-vibration, anti-rust properties and acts as a surface treatment layer for preventing an oxidation of the electrodes 142 and 144. In the embodiment, the insulating layer 34 can be formed on an entire portion of the electrodes 142 and 144 except for portions where the connection member 32 are positioned, and thus, corrosion, damage, or so on of the electrodes 142 and 144 can be effectively prevented.

In addition, the insulating layer 34 including the organic solderability preservative can be easily removed by the connection member 32 including the acidic material and the solder material. Thus, a manufacturing process of the solar cell panel 100 including the connection member 32 and the insulating layer 34 can be simplified. This will be described in more detail later.

In the embodiment, a thickness T1 of the insulating layer 34 can be equal to or less than a thickness T2 of the connection member 32. In particular, the thickness T1 of the insulating layer 34 can be smaller than the thickness T2 of the connection member 32. Because the connection members 32 are connected to the electrodes 142 and 144 through the insulating layer 34 during a manufacturing process, when the thickness T1 of the insulating layer 34 can be relatively small, the connection member 32 and the electrodes 142 and 144 can be stably connected.

For example, the thickness of the connection member 32 can be approximately 30 um to 70 um (for example, approximately 30 um to 50 um). The thickness of the insulating layer 34 can be equal to or greater than 10 um and equal to or less than the thickness of the connection member 32. That is, the thickness of the insulating layer 34 can be approximately 10 um to 70 um (for example, approximately 10 um to 50 um, more specifically, 10 um to 40 um). A process time can be reduced and a manufacturing process can be simplified while maximizing effect of the insulating layer 34 and the connection member 32 in this range.

However, embodiments of the invention are not limited thereto. Therefore, the thickness of the insulating layer 34 can be larger than the thickness of the connection member 32, and the insulating layer 34 and the connection member 32 can have different values from the above-described range.

The first wiring 22a connected to the first electrode 142 of the first solar cell 10a and the second wiring 22b connected to the second electrode 144 of the second solar cell 10b overlap and are connected with the connection wiring 24 longitudinally extending in the first direction crossing the first and second wirings 22a and 22b. Thus, the first solar cell 10a and the second solar cell 10b are connected in series in the second direction. It can be exemplified that the first and second wirings 22a and 22b and the connection wiring 24 are separately formed and are electrically connected to each other in the drawings. In this instance, the first and second wirings 22a and 22b and the connection wiring 24 can be connected to each other by a conductive material layer. The conductive material layer can be the same material as the connection member 32 or can be a different material from the connection member 32.

Two adjacent solar cells 10 of the plurality of solar cells 10 are repeatedly connected by the wiring member 22 and the connection wiring 24 so that the plurality of solar cells 10 are connected to each other in the second direction to form a solar cell string.

In this instance, in the embodiment, a shield member 50 can be disposed to cover the wiring portion 20 (i.e., the wiring member 22 and the connection wiring 24) between the first solar cell 10a and the second solar cell 10b and/or the wiring portion 20 (that is, the bus bar wiring 26) connecting solar cell strings. For example, the shield member 50 can include a first shield member 52 positioned so as to overlap and cover the wiring portion 20 positioned between the first solar cell 10a and the second solar cell 10b and a second shield member 54 positioned so as to overlap and cover the wiring portion 20 connecting the solar cell strings. The shield member 50 can have any of various shapes that can cover the wiring portion 20. The shield member 50 can have a specific color so that the wiring portion 20 can be not visible to an outside, thereby improving an appearance of the solar cell panel 100. The shield member 50 can have a reflectivity different from that of the wiring portion 20 to prevent the wiring portion 20 from being seen from an outside, but can be made of a material that does not completely block the light. Thus, even when the shield member 50 is provided, even a small amount of light can be transmitted through the shield member 50 and thus sufficient light can be incident on the solar cell 10. The shield member 50 can have the same or similar color or same series of colors as the second member 42b to further improve the appearance of the solar cell panel 100.

In one example, the shield member 50 can include a base member 50a and a cohesion layer 50b positioned on one side of the base member 50a. The base member 50a constitutes a body and can have a specific color required for the shield member 50. The cohesion layer 50b can be a layer for making a cohesion between the shield member 50 to the solar cell 10 or the like. Herein, the term of "cohesion" means to have an adhesive strength at which two layers can be attached or separated from each other by physical force at room temperature. Thus, the term of "cohesion" is different from "adhesion". The term of "adhesion" means that two layers are adhered to each other through a heat-treatment and thus one of the two layers can be damaged when the two layers are separated. Since the shield member 50 includes the cohesion layer 50b, it can be easy to adhere and separate the shield member 50, and adjust a position of the shield member 50 during a manufacturing process.

Here, the base member 50a can be formed of an insulating material, and can be formed of, for example, polyethylene terephthalate (PET). In addition, the cohesion layer 50b can be formed of any of various resins having cohesion properties, and can be formed of an epoxy-based resin, an acryl-based resin, a silicone-based resin, or the like.

However, the shield member 50 is not essential, and a stacked structure of the shield member 50, a material of the shield member 50, and the like can have any of various structures or materials other than those described above.

According to the embodiment, surfaces of the electrodes 142 and 144 can be prevented from being oxidized by the insulating layer 34 formed on the electrodes 142 and 144 as a whole. The connection member 32 and the insulating layer 34 can be formed by a simple process. This will be described in detail in a method for manufacturing a solar cell panel 100 referring to FIGS. 1 to 7 and FIGS. 8A to 8E. Detailed description of the portions already described in the above detailed description will be omitted.

Figure 7:
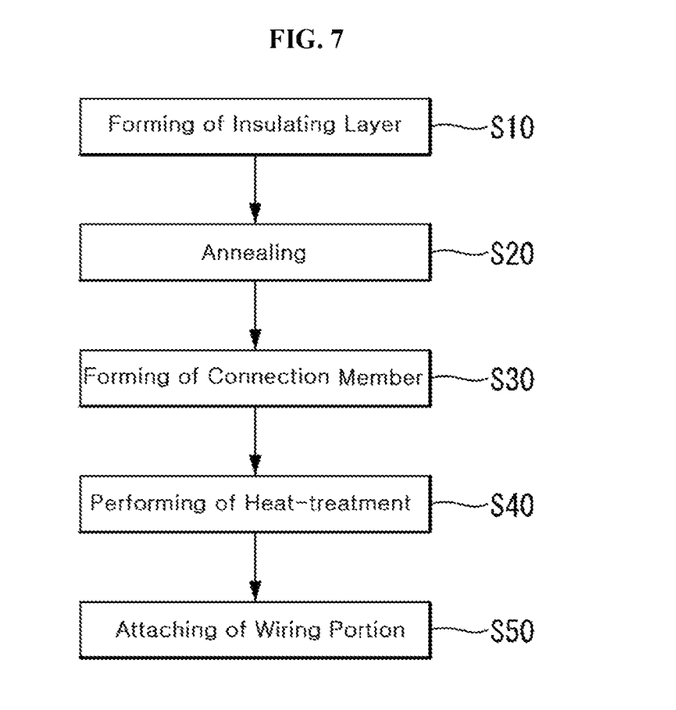
FIG. 7 is a flowchart showing a method for manufacturing a solar cell panel according to an embodiment of the invention.

FIG. 7 is a flowchart showing a method for manufacturing a solar cell panel 100 according to an embodiment of the invention. FIGS. 8A to 8E are schematic views showing the method for manufacturing the solar cell panel 100 shown in FIG. 7. In FIGS. 8A to 8E, (a) shows a back plan view, and (b) shows a schematic sectional view taken along line VIII-VIII. For clarity and simplicity, only a semiconductor substrate 110 and first and second electrodes 142 and 144 are shown for a solar cell 10 in (b) of FIGS. 8A to 8E.

Referring to FIGS. 1 to 7 and FIGS. 8A to 8E, a method for manufacturing a solar cell panel 100 according to the embodiment includes operation S10 of forming an insulating layer 34, operation S30 of forming a connection member 32, operation S40 of performing a heat-treatment, operation S50 of attaching a wiring portion. In operation S10 of forming the insulating layer 34, the insulation layer 34 can be formed on electrodes 142 and 144. In operation S30 of forming the connection member 32, the connection member 32 can be formed on the insulating layer 34 to correspond to a connection portion CP. In operation S40 of performing the heat-treatment, the heat-treatment can be performed so that the connection member 32 penetrates the insulating layer 34 and can be connected to the electrode 142 or 144 through the insulating layer 34 at the connection portion CP. In operation S40 of attaching the wiring portion 20, the wiring portion 20 can be attached on the electrode 142 or 144 through the connection member 32 at the connection portion CP. Also, the method for manufacturing the solar cell panel 100 according to the embodiment can further include operation S20 of annealing between operation S10 of forming the insulating layer 34 and operation S30 of forming the connection member 32.

Figure 8A:
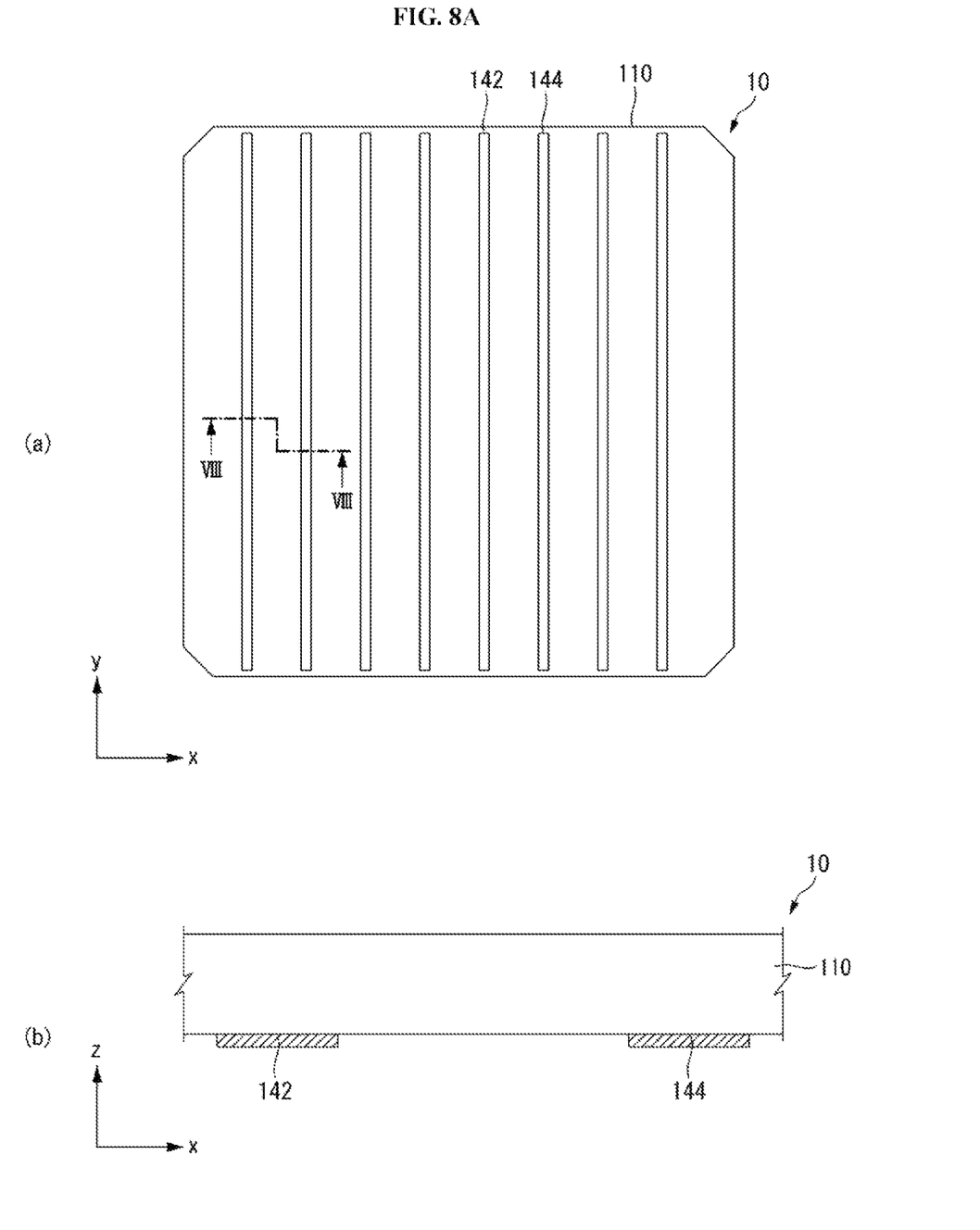
FIGS. 8A to 8E are schematic views showing the method for manufacturing the solar cell panel shown in FIG. 7.

As shown in FIG. 8A, a solar cell 10 having electrodes 142 and 144 formed thereon can be prepared.

Figure 8B:
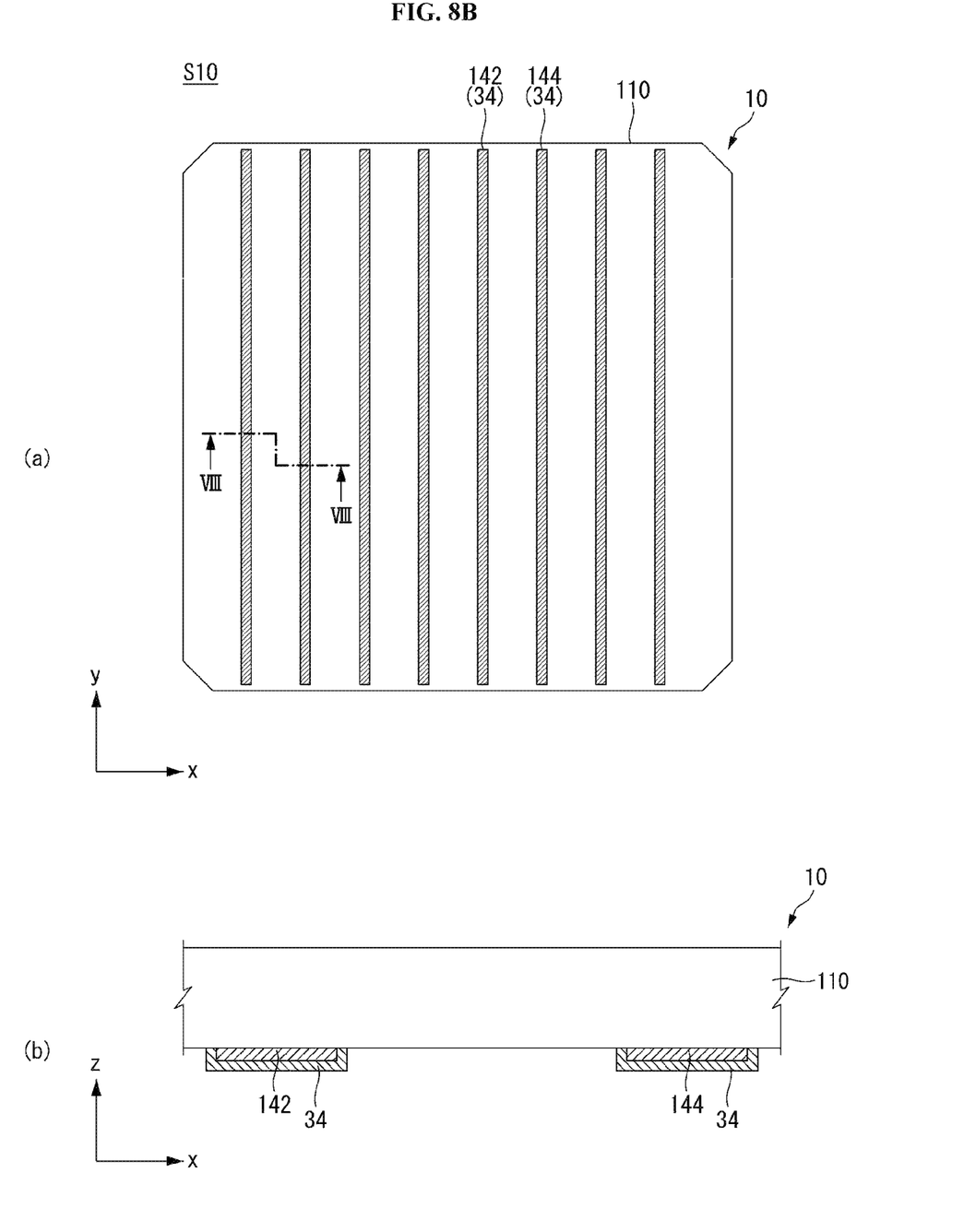

As shown in FIG. 8B, in operation S10 of forming the insulating layer 34, the insulating layer 34 can be formed as a whole on the electrodes 142 and 144 (that is, first and second electrodes 142 and 144). As described above, the insulating layer 34 can be formed to correspond to the first and second electrodes 142 and 144, or can be formed entirely on one surface (i.e., a back surface) of the solar cell 10.

In the embodiment, the insulating layer 34 can be formed of a material that can be removed by the connection member 32 during a heat-treatment. In one example, the insulating layer 34 can include an organic solderability preservative, and the connection member 32 can include a solder material. This will be described in more detail later.

The insulating layer 34 can be formed by any of various methods. For example, the insulating layer 34 can be formed by a spray process that sprays the organic solderability preservative at high pressure to be scattered in a form of a liquid drop or an aerosol. Then, the insulating layer 34 can be formed only on portions corresponding to the first and second electrodes 142 and 144 due to wettability. By such a spraying process, the insulating layer 34 can be stably formed on the first and second electrodes 142 and 144 even in a small amount. Alternatively, the insulating layer 34 can be formed entirely on the first and second electrodes 142 and 144 or on the back surface of the solar cell 10 by various methods such as a dispensing process, a spin coating process, or so on. The insulating layer 34 can be stably positioned by applying the organic solderability preservative and then drying or annealing the organic solderability preservative at room temperature or higher than room temperature to lower fluidity.

In the embodiment, the insulating layer 34 including the organic solderability preservative can have an insulating property such that the electrodes 142 and 144 and the wiring portion 20 are not connected to each other at an undesired portion. The insulating layer 34 including the organic solderability preservative has excellent anti-corrosion, anti-vibration, anti-rust properties and acts as a surface treatment layer for preventing an oxidation of the electrodes 142 and 144.

Next, in operation S20 of annealing, an annealing heat-treatment for stabilizing the electrodes 142 and 144 can be performed. For example, the electrodes 142 and 144 of the solar cell 10 can be formed by a sputtering process. Operation S20 of annealing can be performed in order to stabilize the electrodes 142 and 144 formed by the sputtering process or to improve an adhesion property of the first and second substrates 142 and 144. Alternatively, the organic solderability preservative can be dried or annealed in operation S20 of annealing for stabilizing the electrodes 142 and 144 without separately performing the drying or annealing process after the organic solderability preservative for forming the insulating layer 34 can be applied.

In this instance, in the embodiment, operation S20 of annealing can be not performed before operation S10 of forming the insulating layer 34, and operation S20 of annealing can be performed after operation S10 of forming the insulating layer 34. This is because operation S10 of forming the insulating layer 34 according to the embodiment can be easily realized by a simple process and thus it can be possible to perform operation S20 of annealing after operation S10 of forming the insulating layer 34. Accordingly, the insulating layer 34 already formed can prevent the electrodes 142 and 144 from being oxidized in operation S20 of annealing, and thus, an additional process for removing an oxide layer formed on the electrodes 142 and 144 is not necessary. This will be described in more detail later.

However, operation S20 of annealing is not necessary, and it can be also possible not to perform operation S20 of annealing.

Figure 8C:
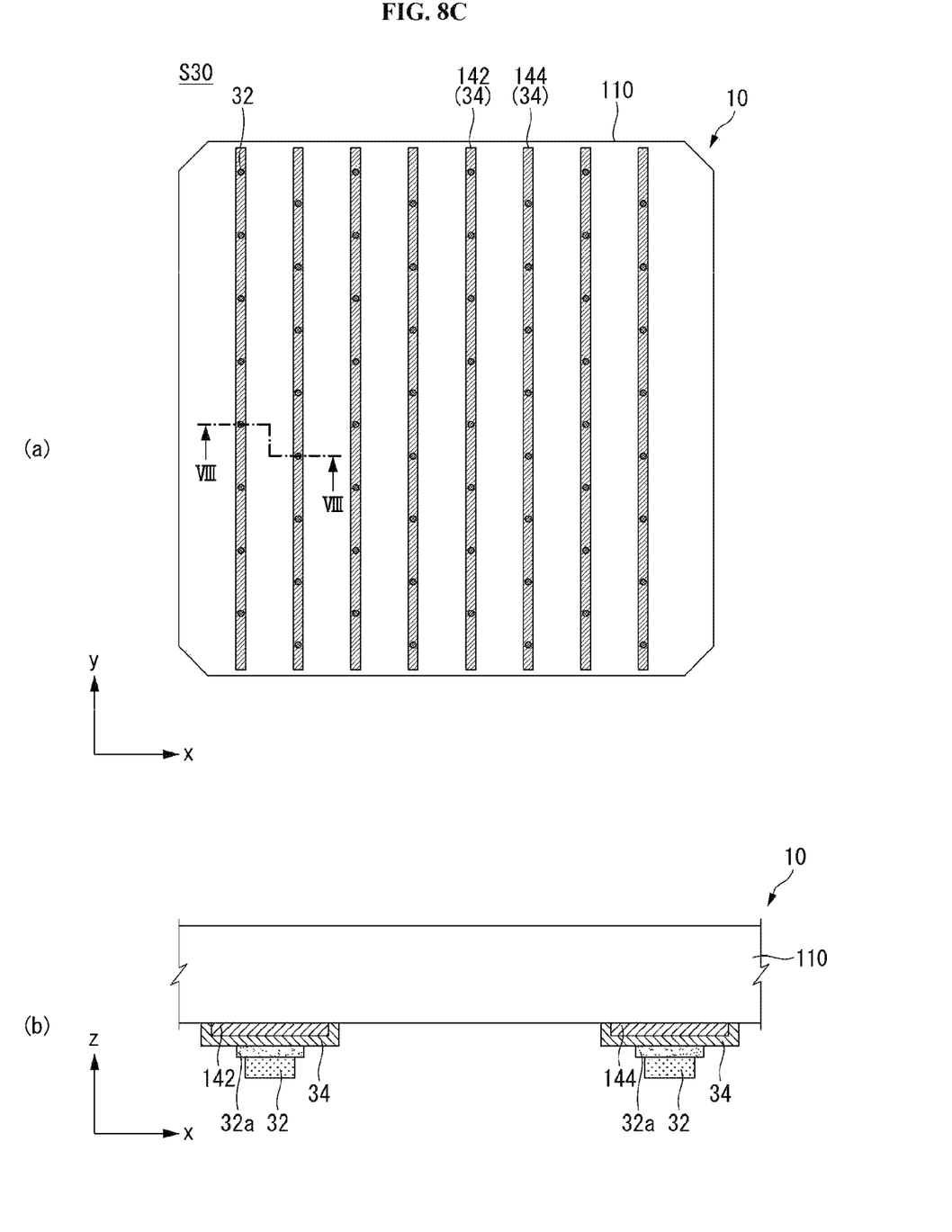

Next, as shown in FIG. 8C, in operation S30 of forming the connection member 32, the connection members are formed on the insulating layer 34 to correspond to the connection portions CP to which the electrodes 142 and 144 and the wiring portion 20 are to be connected. In this instance, a plurality of connection members 32, each having an island shape to correspond to the connection portion of the electrode 142 or 144 and spaced apart from each other, can be provided on the insulating layer 34.

As described above, the connection member 32 having a predetermined pattern and positioned on the insulating layer 34 can be formed by any of various methods. For example, when the connection member 32 can be formed by a printing process, the connection member 32 having a pattern can be formed by a simple process. In the embodiment, the connection member 32 can include a solder material. Any of various materials known as solder materials can be used.

In this instance, a flux for assisting in removing the insulating layer 34 can be formed adjacent to the insulating layer 34 to correspond to the connection portion CP. This flux can be provided in a form of a separate flux layer 32a separately formed from the connection member 32 between the insulating layer 34 and the connection member 32 as shown in (b) of FIG. 8C. Some of flux materials included in the flux layer 32a can be included in the connection member 32 after operation S40 of performing the heat-treatment. Alternatively, a flux can be supplied in a state the flux can be initially included in the connection member 32. As a flux that allows the insulating layer 34 including the organic solderability preservative to be easily removed by the connection member 32, any of known various materials can be used. For example, when a solvent (a so-called post-flux) having an alcoholic material and an acidic material and having a viscosity can be used, the insulating layer 34 formed of the organic solderability preservative including imidazole and the like can be easily removed. However, embodiments of the invention are not limited thereto, and a separate flux (for example, a post-flux) need not be used.

Figure 8D:
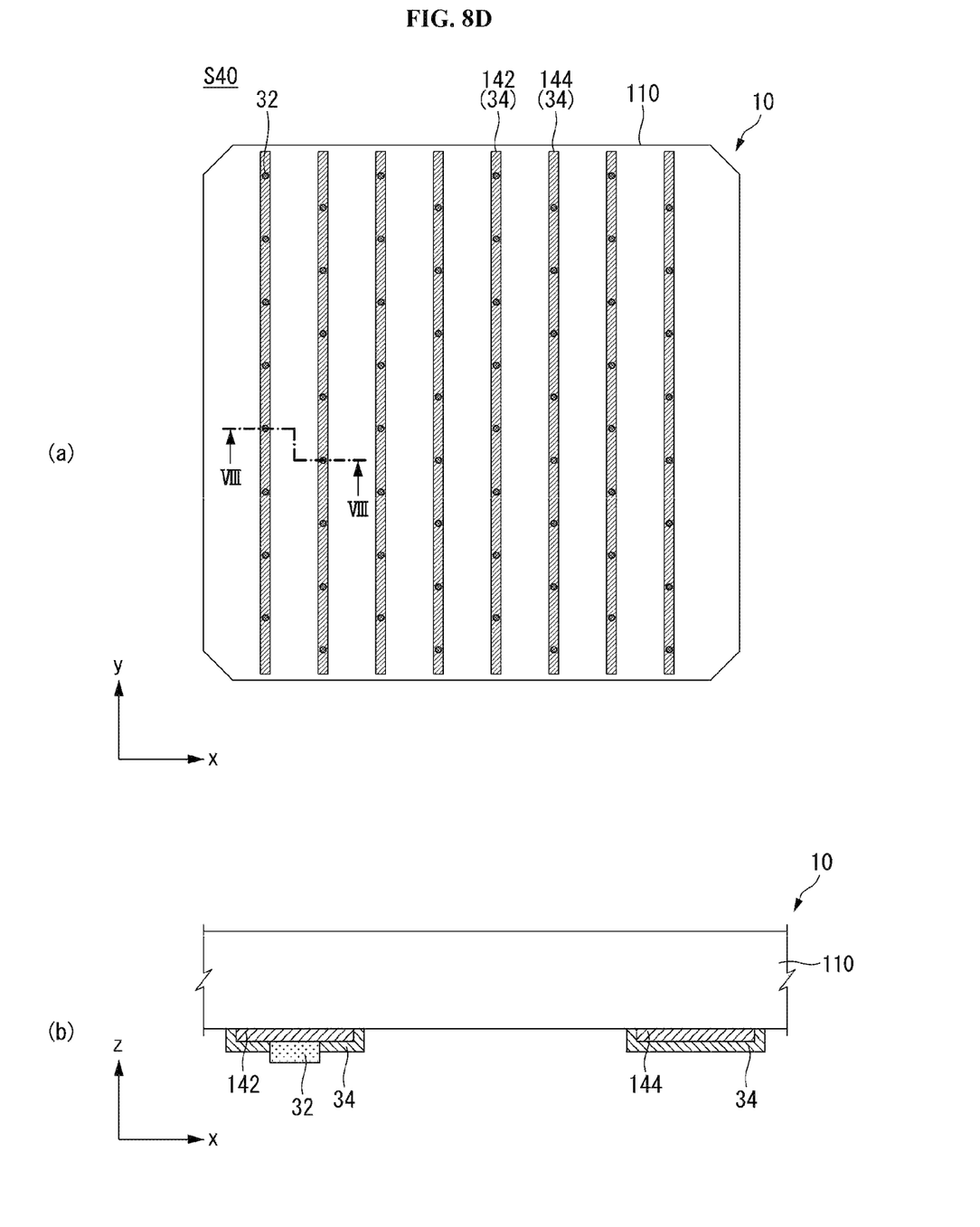

Next, as shown in FIG. 8D, in operation S40 of performing the heat-treatment, the heat-treatment can be performed so that the connection members 32 penetrate the insulating layer 34 and are connected to the electrodes 142 and 144. In this instance, operation S40 of performing the heat-treatment can be a reflow process for melting the solder material of the connection member 32. As an example, operation S40 of performing the heat-treatment or the reflow process can be performed at a temperature of approximately 200 to 300° C. The connection members 32 can be stably connected to the electrodes 142 and 144 even when the heat-treatment is performed at a low temperature, and a burden on the solar cell 10 can be minimized by a low temperature.

As described above, when the connection member 32 includes the solder material and the insulating layer 34 includes the organic solderability preservative, the insulating layer 34 including the organic solderability preservative can be easily removed by melting or burning of the organic solderability preservative at a portion where the connection member 32 can be positioned in the reflow process. Then, an opening can be formed at a portion of the insulating layer 34 where the connection member 32 can be positioned, and the opening can be filled with the connection member 32. Accordingly, the connection member 32 can be easily connected to the electrodes 142 and 144 by the reflow process. The connection members 32 can be connected to the electrodes 142 and 144 by a simple process performed at a low temperature without adding a separate process.

Figure 8E:
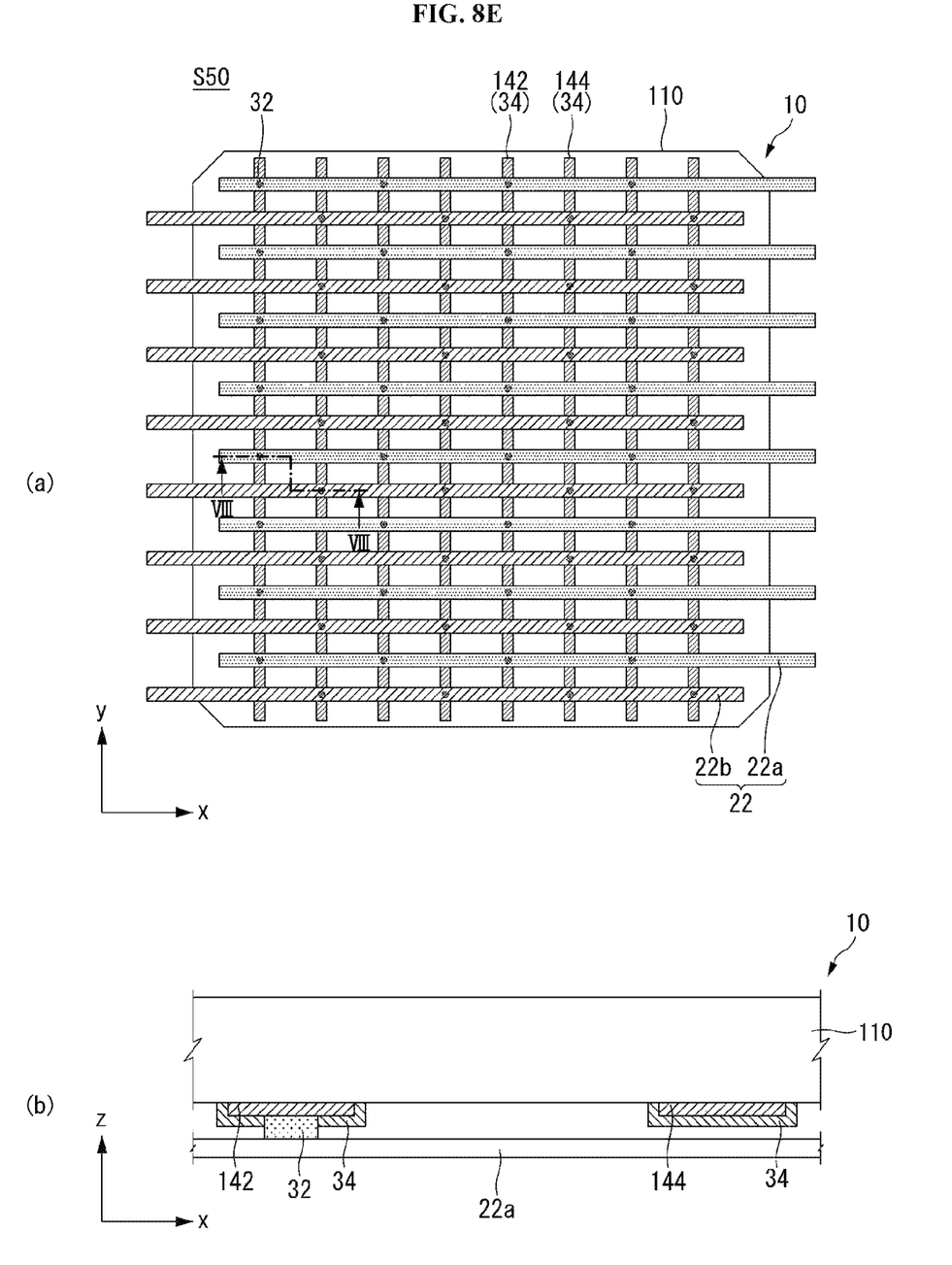

Next, as shown in FIG. 8E, in operation S50 of attaching the wiring portion 20, the wiring portions 20 (particularly, the first and second wirings 22a and 22b) are attached on the electrodes 142 and 144 through the connection member 32. Any of various processes known as a process of attaching the wiring portion 20 (for example, a tabbing process) can be applied, but embodiments of the invention are not limited thereto. Although only the wiring member 22 is shown in FIG. 8E, a connection wiring 24 and/or a bus bar wiring 26 can be connected together with the wiring member 22. Also, operation S40 of performing the heat-treatment and operation S50 of attaching the wiring portion 20 can be performed at the same time, not being performed in a separate process.

The shield member 50 can be attached to the solar cell 10 to which the wiring portion 20 can be attached and can be laminated together with the sealing member 44, the first member 42a, and the second member 42b to manufacture the solar cell panel 100.

As described above, according to the embodiment, the connection member 32 penetrating through the insulating layer 34 can be formed by a simple process, and thus, a structure and a process of the solar cell panel 100 can be simplified. Since an oxide layer that can be undesirably formed on the electrodes 142 and 144 can be prevented from being formed by the insulating layer 34 acting as a surface treatment layer, a separate process for removing the oxide layer need not be performed. Accordingly, the process can be simplified more and the damage of the solar cell 10 which can occur in the process of removing the oxide layer can be prevented. Accordingly, the solar cell panel 100 having a high output and excellent long-term reliability can be manufactured by a simple manufacturing process.

On the other hand, in the conventional art, all of a connection member and an insulating member for connecting and insulating an electrode and a wiring portion have an island shape. In this instance, a number of the connection members and the insulating members are too great, there was a problem that a process time was increased and an alignment was not performed well. Also, a surface of an electrode on which the connection member and the insulating member are not formed can be corroded, thereby lowering efficiency of a solar cell. In particular, an annealing process for stabilizing the electrode must be performed after forming the connection member and before forming the insulating member, and an oxide layer can be undesirably formed on the surface of the electrode during the annealing process. Accordingly, an etching process using a plasma or the like can be performed to remove the oxide layer between the annealing process and a process of forming the connection member. As a result, the process becomes very complicated and efficiency of the solar cell can be deteriorated due to the etching process using plasma or the like.

The features, structures, effects and the like according to the above-described embodiments are included in at least one embodiment of the invention, and the invention is not necessarily limited to only one embodiment. Further, the features, structures, effects and the like illustrated in the embodiments can be combined and modified in other embodiments by other persons skilled in the art to which the embodiments belong. Therefore, it is to be understood that combined or modified embodiments are included in the invention.

What is claimed is:
1. A method for manufacturing a solar cell panel, the method comprising:
forming an insulating layer on an electrode of a solar cell;
forming a connection member on the insulating layer to correspond to a connection portion on which the electrode and a wiring portion are to be connected;

performing a heat-treatment on the connection member so as to penetrate through the insulating layer and to be connected to the electrode at the connection portion; and attaching the wiring portion on the electrode at the connection portion through the connection member.

2. The method according to claim 1, wherein the insulating layer comprises an organic solderability preservative (OSP), and wherein the connection member comprises a solder material.

3. The method according to claim 2, wherein, in the forming of the connection member, a flux for removing the insulating layer or assisting a removal of the insulating layer is positioned adjacent to the insulating layer.

4. The method according to claim 1, further comprising:

annealing for increasing an adhesion property of the electrode of the solar cell between the forming of the insulating layer and the forming of the connection member.

5. The method according to claim 1, wherein the insulating layer is formed on an entire portion of the electrode except for a portion where the connection member is formed, after the performing of the heat-treatment.

6. The method according to claim 5, wherein the connection member comprises a plurality of connection members, each having an island shape to correspond to the connection portion, at the electrode, and wherein the insulating layer is entirely formed on the electrode except for a portion where the plurality of connection members are positioned, after the performing of the heat-treatment.

7. The method according to claim 1, wherein a thickness of the insulating layer is equal to or less than a thickness of the connection member.

8. The method according to claim 7, wherein the thickness of the insulating layer is approximately 10 um or more, and wherein the thickness of the connection member is approximately 30 um to 70 um.

9. The method according to claim 1, wherein the forming of the insulating layer is performed by a spraying process, a dispensing process, or a spin coating process, and wherein the forming of the connection member is performed by a printing process.

10. The method according to claim 2, wherein the performing of the heat-treatment is a reflow process for melting the solder material of the connection member.

11. The method according to claim 10, wherein the performing of the heat-treatment is performed at a temperature of approximately 200 to 300° C.

12. The method according to claim 1, wherein the electrode comprises a nickel-vanadium alloy layer, and wherein the connection member comprises an acidic material.

* * * * *